United States Patent [19]
Yamamoto et al.

[11] Patent Number: 4,785,316
[45] Date of Patent: Nov. 15, 1988

[54] IMAGE RECORDING DEVICE

[75] Inventors: Takemi Yamamoto; Hitoshi Nakai; Yoichi Horaguchi; Makoto Suzuki, all of Nagoya, Japan

[73] Assignee: Brother Kogyo Kabushiki Kaisha, Nagoya, Japan

[21] Appl. No.: 157,740

[22] Filed: Feb. 18, 1988

[30] Foreign Application Priority Data

Feb. 18, 1987 [JP] Japan .................................. 62-35240

[51] Int. Cl.$^4$ ........................................... G01U 15/00
[52] U.S. Cl. .................................. 346/156; 346/160.1
[58] Field of Search .................... 346/150, 153.1, 160, 346/107 R, 108, 160.1, 76 PH; 400/119; 101/DIG. 28, 463.1, 465, 467, 469, 470, 471; 358/302, 296; 355/5, 19, 27

[56] References Cited

U.S. PATENT DOCUMENTS 4,466,006  8/1984  Takahashi et al. ............... 346/153.1
4,660,961  4/1987  Karamoto et al. ............... 346/153.1

Primary Examiner—Arthur G. Evans
Attorney, Agent, or Firm—Kane, Dalsimer, Sullivan, Kurucz, Levy, Eisele and Richard

[57] ABSTRACT

An image recording device wherein an image is recorded on a photo-sensitive recording medium and said image is once formed as a light-shield image before recorded on the photo-sensitive recording medium. The device comprises light-shield image forming means for forming the light-shield image in a reduced size with respect to the image to be recorded, and enlarged image recording means for recording an image corresponding to the light-shield image in an enlarged size on the photo-sensitive recording medium.

14 Claims, 4 Drawing Sheets

IMAGE RECORDING DEVICE

BACKGROUND OF THE INVENTION

This invention relates to an image recording device for recording an image on a photo-sensitive receding medium.

Such an image recording device has been proposed in the U.S. Ser. No. 50,313 filed on May 14, 1987 as a first exposure means forms a latent image responsive to image information on a sensitized drum, and a first developing means develops with toners a light-shield visible image corresponding to the latent image. The visible image is then transferred to a light-transmissive element consisting of an endless roll of a insulated transparent film by means of transfer means to be carried onto the photosensitive recording medium through movement of said light-transmissive element. A second exposure means shines the recording medium with a diffused light passed through the visible image on the light-transmissive element to form a latent image on the recording medium, which is then developed by a second developing means. In the above device, however, a light-shield visible image equal size to the image information is formed on the sensitized drum, which is then transferred to the transmissive element, and exposure by a second exposure means has taken place with the transmissive element closely joined to the recording medium. Accordingly, a latent image equal in size to the light-shield visible image is formed on the recording medium and developed to a visible image.

It is therefore required to make the dimensions equal in width of the sensitized drum, the transmissive element consisiting of the insulated transparent film and their associated components, which resulting in increased bulk and cost of the whole device. Not only that, required during operation is a large volume of toners as light shield materials and a sufficiently wide light-transmissive element for replacement, which resulting in high running cost.

Moreover, the wide sensitized drum as above has caused such problems as non-uniform sensitization along its width and irregular feed of toners in width during development by the first exposure means, the width of exposure light has tended to vary across the width of the sensitized drum because of differences of laser beam spot diameters in horizontal scanning direction which are due to varying lengths of optical path of the optical system. This has resulted in a difficulty in forming an image of uniform quality across the whole width of the recording medium.

Furthermore, the sheet-form light-transmissive element with such a greater width has tended to laterally skew and to slack or crease at the area exposed by the second exposure means. This has again caused a problem in quality of the image formed on the recording medium.

SUMMARY OF THE INVENTION

It is therefore an object of the invention to provide an improved image recording device capable of reducing the dimensions in width of the latent image carrier, the sheet-form transmissive element and their associated components for a more compact and less expensive device.

Another object is to provide an image recording device capable of cutting down the running cost of the device with lower expenditure for expendables such as shield materials.

Other object is to provide an image recording device capable of minimizing non-uniform formation of the light-shield image on the image carrier, slack and creases of the sheet-form transmissive element at its exposure area, whereby an image of uniform and superior quality can be formed across the whole width of the recording medium.

According to this invention, there is provided an image recording device wherein an image is recorded on a photo-sensitive recording medium and said image is once formed as a light-shield image before recorded on said photo-sensitive recording medium, which comprises: light-shield image forming means for forming said light-shield image in a reduced size with respect to said image to be recorded; and enlarged image recording means for recording an image corresponding to said light-shield image in an enlarged size on said photo-sensitive recording medium.

With the image recording device as above constructed, the light-shield image is formed in reduced size with respect to the image to be recorded, but the image enlarged with respect to said light-shield image is formed on said recording medium, which makes it possible to adopt smaller deimensions in width of the image carrier and its associated components, thereby minimizing non-uniform formation of the lightshield image on the image carrier, assuring an image of superior quality on the recording medium.

DESCRIPTION OF THE ACCOMPANYING DRAWINGS

DESCRIPTION OF THE PREFERRED EMBODIMENTS

Figure 1:
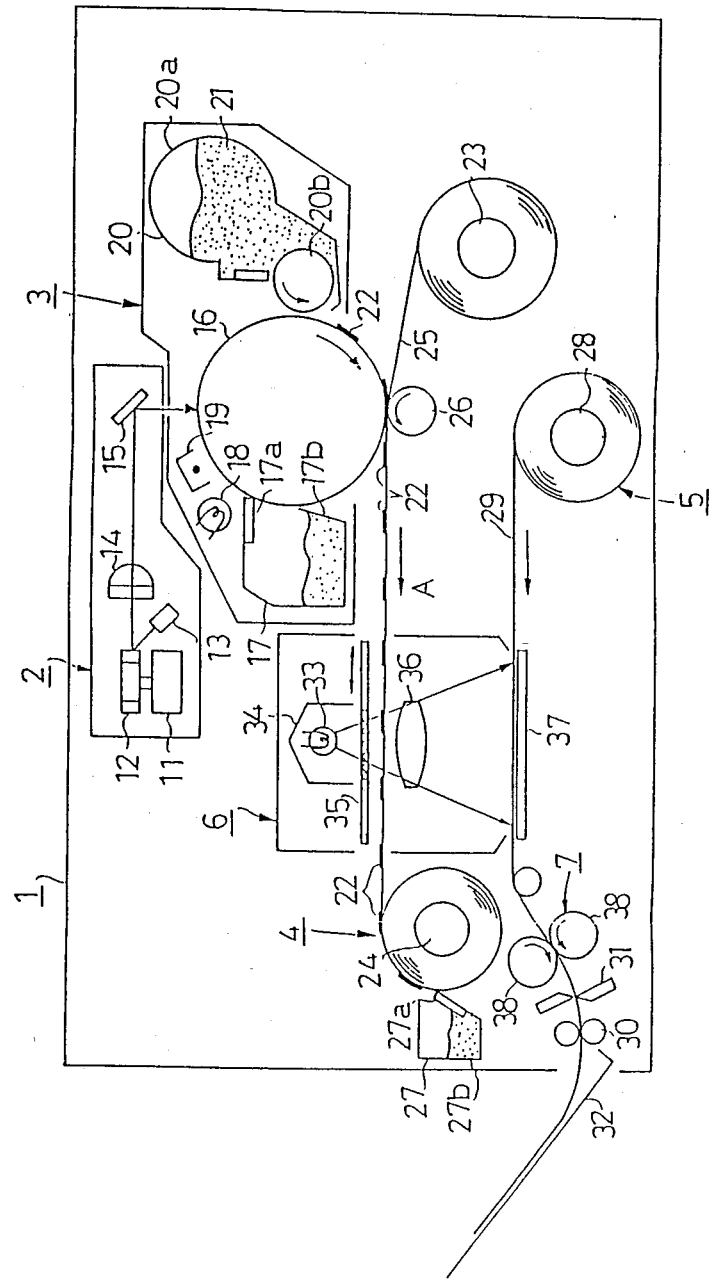
FIG. 1 is a schematic structural view showing a color image recording device embodying an invention.

FIG. 1 illustrates a color image recording device 1 embodying the invention, which accommodates therein a laser scanner unit 4, a recording paper trasport unit 5, an exposure unit 6 and a pressurizing and developing unit 7.

The laser scanner unit 2 forms a latent image on a sensitized drum 16 to be described later in response to given image information, and comprises a motor 11, a polygonal mirror 12 rotated by said motor 11, a semiconductor laser 13, which emits laser beam to shine said polygonal mirror 12, an fθ lens 14, and a planar mirror 15 which directs the laser beam to the sensitized drum 16.

The Xerography unit 3 comprises a sensitized drum 13 as its basic element, about which a cleaning unit 17, a de-sensitizer 18, a sensitizer 19, the exposure area of said laser scanner unit 2 and a developing unit 20 are arranged in the rotational direction of the sensitized drum 16.

With rotation of the sensitized drum 16, the cleaning blade 17a of the cleaning unit 17 scrapes toners off the outer circumference of the sensitized drum 16. The sensitized drum 16 is then uniformly sensitized again by the sensitizer 19. In the meantime, under control of a CPU (central processing unit 41: refer to FIG. 3), the laser beam from the laser scanner unit 2 impinges on the sensitized drum 16 to eliminate the charge at the image carrying parts in accordance with the image information received from the image information input unit 42, whereby a latent image responsive to the information is formed on the sensitized drum 16 with a given contraction ratio with respect to the image imformation.

The developing unit 20 is provided with a toner case 20a which retains black toners 21 serving as light shield materials which are charged with the same polarity as the parts of the sensitized drum 16 carrying no image, and with a developing sleeve 20b. Thus, the toner 21 does not deposit on the parts without image of the sensitized drum 16 because of static repulsion, while it deposits well on the image carrying parts thereof. With this so-called reverse effect, a light-shield visible image 22 is developed on the sensitized drum 16 which corresponds to the latent image mentioned above.

Normal development process may of course be carried out instead of the reverse process as set forth above. In this case, the uniformly sensitized drum 16 has formed thereon parts to be illuminated which correspond to the parts without image of the image information. With the charge retained on the parts corresponding to the image, the toners 21 charged with the opposite polarity to the image carrying parts are statically attracted to the image carrying parts to thereby develop a light-shield image 22.

The transmissive element transport unit 4 includes a pair of rollers 23 and 24, a sheet-form transmissive element 25 made of such transmissive material as polyethylene telephtalate, which is at its both ends wound around the rollers 23 and 24 and is conveyable from one roller 23 to the other 24, a trandsfer roller 26 located under the transmissive element 25 to be associated with the sensitized drum 16, and a cleaning unit 27 located adjacent to the other roller 24.

The transfer roller 26 supplies the transmissive element 25 with a charge opposite to the toner 21, which is enough to remove the toners 21 deposited on the sensitized drum 16, so that the lightshield developed image 22 on the sensitized drum 16 is transferred onto the transmissive element 25. The cleaning unit 27 is provided with a cleaning blade 27a and a return toner case 27b so that the light-shield developed image 22 transferred to the transmissive element 25 which has been used as a mask is scraped off and removed the transmissive element 25 to be collected into the return toner case 27b.

The recording paper transport unit 5 faces the exposure unit 6 thereunder, and comprises a single takeup roller 28, a serial photo-sensitive recording paper 29 serving as a sensitized recording medium which is unwound from the takeup roller 28 extends on the side of the transmission element 25 opposite to the light-shield developed image 22 at a certain distance therefrom, a pair of conveyer rollers 30 which run the recording paper 29 in the same direction of movement of the transmissive element 25, a cutter unit 31 which cuts the recording paper 29 to a certain length, and a discharge tray 32 to receive cut-off pieces of the recording paper 29.

Figure 2:
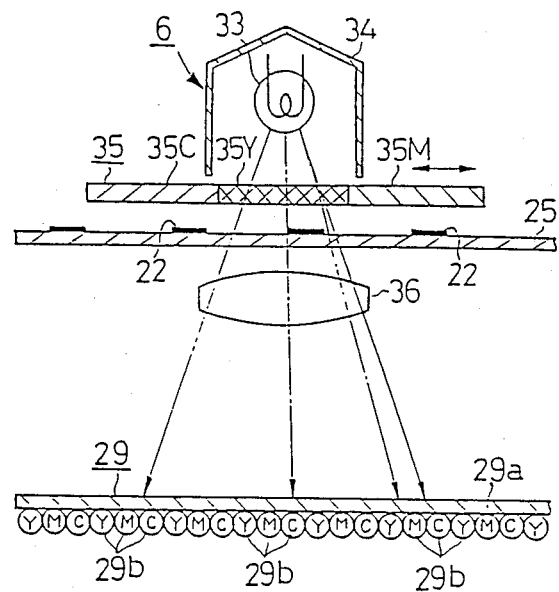
FIG. 2 is an enlarged section of the exposure unit of the device shown in FIG. 1.

In this embodiment, a photo and pressure sensitive recording paper for color print such as disclosed in the U.S. Pat. No. 4,440,846 is used as the recording paper 29, so that, as illustrated in FIG. 2, a base element of transparent resin 29a is coated on its back surface with microcapsules 29b, which contain one of dye precursors of cyan, magenta and yellow for three primary colors and photo-curable resin, and a developing agent for color development in reaction to the dye precursors.

The exposure unit 6 provides exposure means which forms a latent image on the recording paper 29 in accordance with the light-shield developed image 22 on the transmisive element 25, and comprises an exposure lamp 33, a condenser 34, a linealy movable filter 35 which allows the light with a wavelength corresponding to cyan, magenta or yellow to pass therethrough separately, a lens 36 serving as enlarging means which magnifies the light passed through the filter 35 with a given magnification ratio and exposes it onto the recording paper 29, and an exposure tray 37 to hold the recording paper 29 in position.

The filter sections 35Y, 35M and 35C of the filter 35 for the respective colors are selectively located on the optical path. With this selected position of the filter 35, the side of the transmissive element 25 carrying the light-shield developed image 22 is illuminated with a light strong enough to make the recording paper 29 sensitive to it. This causes microcapsules 29b to be photo-cured only on the area other than the parts shielded from the light because of the light-shield developed image 22. A latent image responsive to the light-shield developed image 22 is thus produced on the recording paper 29 with a certain magnification ratio given by the lens 36 with respect to the light-shield developed image 22.

The pressurizing and developing unit 7 is for developing the latent image on the recording paper 29 to a visible image, and consists of a pair of pressure rollers 38 separable from each other. The recording paper 29 is passed under pressure between the rollers 38 to rupture the microcapsules 29b remaining uncured, so that the dye precursors squeezed out of the ruptured microcapsules react to the developing agent coated on the recording paper 29 to develop the latent image on the recording paper 29 to a visible image equal in size to the input image information.

Figure 3:
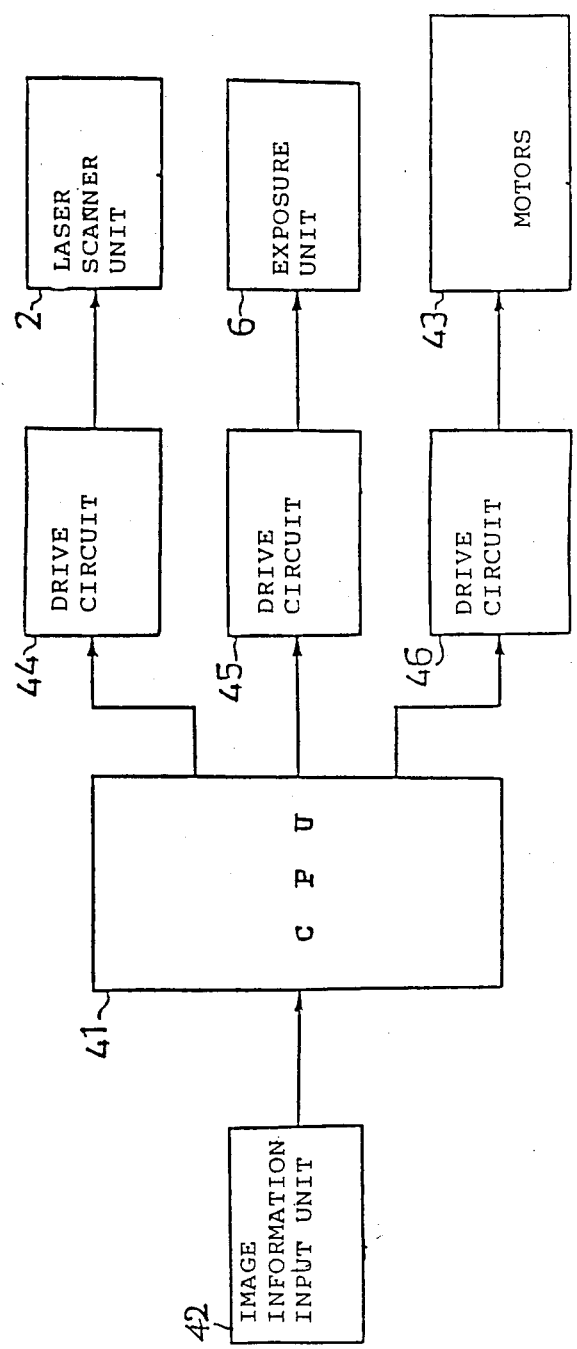
FIG. 3 is a block diagram of a control circuit of the device shown in FIG. 1.

The control circuit for the above constructed image recording device is now described with reference to FIG. 3, wherein the CPU 41 has connected thereto the image information input unit 42, through which certain image information is entered into the CPU 41. Further connected to the CPU 41 are motors 43 to drive the laser scanner unit 2, the exposure unit 6, the sensitized drum 16, and the rollers 23, 24 and 30 by way of drive circuits 44, 45 and 46, to which the CPU 41 sends drive signals.

In this embodiment, under control of the CPU 41, the image information sent from the image information input unit 42 is reduced with a certain contraction ratio when output from the laser scanner unit 2 so as to form a latent image of reduced size on the sensitized drum 16. Assuming the magnification ratio when producing image on the photo-sensitive recording paper 29 through the imaging lens 36 at m, the contraction ratio of the latent image on the sensitized drum 16 is set to its reciprocal, 1/m in this embodiment. Consequently, the sensitized drum 16, the transmissive element 25, and their associated laser scanner unit 2, the Xerography unit 3 and the transmissive element transport unit 4 may be as wide as 1/m in the device according to this embodiment.

Motors 43 for operating those units mentioned above are brought into a time-controlled drive by means of the CPU 41 so that, with the rotation of the sensitized drum 16 in the clockwise direction in FIG. 1 at a certain speed, the transmissive element 25 is run in the arrow-indicated direction at the same speed as the rorational speed of the sensitized drum 16.

The color image recording device constructed as above is now described in particular regard of the operational order of color printing.

In the color printing apparatus, the latent image is formed on the photo-sensitive recording paper 29 in the order of yellow, magenta and cyan. In more particular, when the sensitized drum 16 is rotated in the clockwise direction in FIG. 1, the transmissive element 25 is moved in the arrow-indicated direction to that the laser scanner unit 2 and the developing unit 20 produces the light-shield developed image 22 corresponding to yellow on the sensitized drum 16 which is reduced in size with the given contraction ratio with respect to the image information, said developed image 22 being transferred to the transmissive element 25 by means of the transfer roller 26.

With the filter section 35Y for yellow of the interference filter 35 selected on the optical path of the exposure unit 6, the photo-sensitive recording paper 29 is illuminated with light passed through the filter 35Y, the developed image 22 on the transmissive element 25 and the lens 36. Among the microcapsules 29b for yellow, those which have not been exposed to light because of shielding effect of the light-shield image 22 do not undergo photo-curing reaction, while other microcapsules for yellow exposed to light are photocured to produce the latent image correspondng to yellow on the recording paper 29 which is enlarged with the given magnification ratio with respect to the light-shield image 22.

The cleaning unit 27 then removes the developed image 22 for yellow from the transmissive element 25, and then the transmissive element 25 is moved in the direction opposite to the arrow A in FIG. 1 through winding motion of the roller 23, whereby it is located at the position initiating transfer of the yellow visible image facing the transfer roller 26. At this time, the recording paper 29 is held stationary under the exposure unit 6 for the next exposure.

Magenta and cyan latent images are similarly produced on the recording paper 29 by transferring the contracted developed image 22 for magenta or cyan formed on the sensitized drum 16 to the transmissive element 25, placing the latter exposure by the exposure unit 6, illuminating it with magenta or cyan filter sectors 35M of 35C selectively located on the optical path of the exposure unit 6, whereby an enlarged latent image corresponding to magenta or cyan is produced on the recording paper 2.

When formation of the latent image for each of three colors is completed, the recording paper 29 is moved by the conveyer roller 30 to be pressurized between the pressure rollers 28 so that the microcapsules for each color remaining uncured are ruptured and the dye precursors coming from them react to the developing agent to produce a color image equal in size to the input image information on the recording paper 29.

As above, with the color image recording device embodying the invention, the light-shield image reduced with the given contraction ratio with respect to image information is produced on the sensitized drum 16, and the light-shield developed image is then transferred to the sheet-form transmissive element 25. Through the transmissive element 25 carrying the developed image 22, the photo-sensitive recording paper 29 is exposed to light, so that the latent image enlarged with the given magnification ratio with respect to said light-shield image 22 is formed and developed on the photo-sensitive recording paper 29.

This makes it possible to adopt smaller dimensions in width of the latent image carrier and its associated components, thereby minimizing non-uniform sensitization of the drum 16, non-uniform exposure to laser beam, and/or irregular feed of toners 21 along the width of the transmissive element 25, assuring an image of superior quality produced on the photosensitive recording paper 29.

Also, in this embodiment, the sheet-form transmissive element 25 is at its both ends wound around the rollers 23 and 24 for movement between them. Should, for instance, the cleaning blade 17a of the cleaning unit 27 scratch or soil a certain section of the transmissive element 25, the left-hand roller 24 may be rortated by suitable means such as a takeup switch to take up the scratched or soiled section onto the left-hand roller 24, while unwinding a new section from the right-hand roller 23. This provides a resultant recorded image of high quality with little irregularity on the recording paper 29.

When the whole length of the transmissive element 25 has been consumed and completely wound around the left-hand roller 24, the used transmissive element 25 can be easily removed together with the rollers 23 and 24 and replaced with a new set of transmissive element 25. Thus, replacement of the transmissive element 25 may take place more easily compared to the transmissive element in the form of endless belt being extended between a pair of rollers for continuous rotation. Unlike the endless belt type arrangement of the transmissive element, the transmissive element 25 in this embodiment has its under space kept open. This allows a free choice of location of the photo-sensitive recording paper with minimized interference to the transmissive element 25 when loading the photo-sensitive recording paper 29.

Moreover, when the endless belt type transmissive element is continously turned in one direction through rotation of the roller pair, the transmissive element has tended to skew with respect to the axes of the rollers to cause misalignment of the exposure area. This has been particularly serious because of greater width of the transmissive element, resulting in a blurred image formed on the recording paper. In this embodiment, however, the transmissive element 25 is at its both ends wound around the roller pair 23 and 24 while providing a sufficiently small width of the transmissive element 22. This minimizes such widthwise skewing, assuring a blurless clear image formed on the recording paper 29.

Though not illustrated in the accompanying drawings, in the aforementioned embodiments, the lens 36 of the exposure unit 6 may have a facility to vary the magnification ratio so that the magnification of the latent image to be produced on the photo-sensitive recording paper 29 can be arbitrarily set and varied. Further, the transmissive element 25 may be taken up onto the left-hand roller 24 by a certain length for a predetermined number of exposure operations allowing a certain length of new section to be unwound for use.

On the other hand, the photo-sensitive recording paper 29 may be of a certain number of cut sheets stored in pile in the paper feed cassette to be fed to the exposure area of the exposure unit 6 sheet by sheet by the paper feed unit. The photo-sensitive recording paper 29 also may have coated thereon only with microcapsules 29b that include transparent resin base 29a containing dye precursor for each primary color and photo-curable resin, while developing agent may be applied to a separate transfer sheet. Further, the photo-sensitive recording paper 29 may coated with microcapsules which contain only one of individual dye precursors for black, yellow, magenta and cyan to provide a single-color image recording device.

Figure 4:
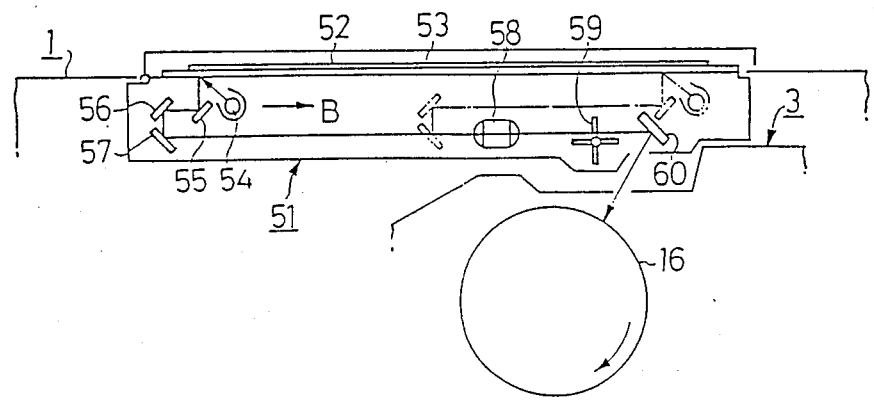
FIG. 4 is a partial schematic structural view showing a modified color image recording device.

FIG. 4 illustrates a modification of the color image recording device 1, wherein the laser scanner unit 2 is replaced with an exposure unit 51. As the same arrangements as that of the device illustrated in FIG. 1 is applied to other parts, detailed explanation thereof has been eliminatd.

The exposure unit 51 in this modification is provided with a transparent glass text tray 53 for placing a text 52 thereon, an exposure lamp 54, a first to third planar mirrors 55, 56 and 57, a lens 58, a filter element 59 and a fourth planar mirror 60. The lens has a given contraction ratio 1/m. The exposure lamp 54 and the first planar mirror 55 are moved in the direction of the arrow B at a speed of mv with respect to the rotational speed v of the sensitized drum 16, while the second and third planar mirrors 56 and 57 are moved in the same direction at a speed of ½ mv, so that the distance of the optical path between the exposure lamp 54 and the lens 58 is kept constant.

The filter element 59 includes color separation sectors for cyan, magenta and yellow and a monochrome filter section. With this filter sectors selectively located on the optical path, the exposure lamp 54 shines the text 52 on the text tray 53 during movement of the exposure lamp 54 and the first to third planar mirrors 55 to 57. The reflections from the text 52 are then sent to the sensitized drum 16 by way of the first to third planar mirror 55, 56 and 57, the selected filter section of the filter element 59 and the fourth mirror 60, thus producing a latent image responsive to the image on the text 52 reduced in size with the given contraction ratio of 1 /m.

Figure 5:
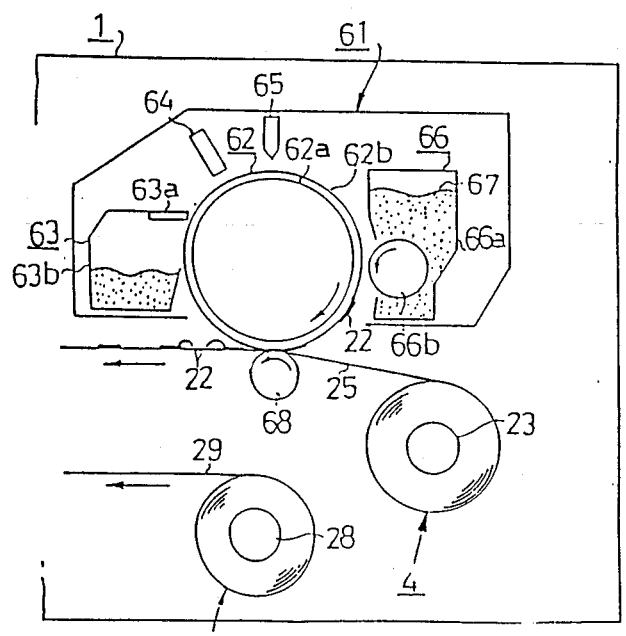
FIG. 5 is a partial schematic structural view showing a further modified color image recording device.

FIG. 5 illustrates a further modification of the device 1, wherein the laser scanner unit 2 and the Xerography unit 3 are replaced with a magnetography unit 61. The magnetography unit 61 comprises a magnetized drum 62, about which a cleaning unit 63 with a cleaning blade 63a and a return toner case 63b, a de-magnetizer 64, a magnetizing head 65, a developing unit 66 including a case 66a strong black magnetic toners 67 as light-shield materials and a development sleeve 66b, are arranged in the rotational direction of the magnetized drum 16.

The magnetizing head 65 forms the latent image on the magretized drum 62 with the given contraction ratio with respect to the image information.

The magnetic drum 62 consists of a drum body 62a of aluminum, the circumferential surface of which is coated with a magnetic layer 62b. With rotation of the magnetized drum 16, the cleaning unit 63 removes the magnetic toners from the outer circumference of the magnetized drum 62, while the latter is de-magnetized by the de-magnetizr 64. A magnetic latent image responsive to the image information is then formed on the magnetizd drum 62 with the given contraction ratio with respect to the image information. Magnetic toners 67 are magnetically deposited on the magnetic latent image by the developing unit 66 thus producing a light-shield visible image 22.

In this modification, the transfer roller 68 as transfer means develops static attraction enough to remove the magnetic toners 67 deposited on the magnetized drum 62, so that the light-shield visible image 22 on the magnetized drum 62 is transferred to the transmissive element 25. Then, as in the device of FIG. 1, the latent image enlarged with the given magnification ratio is formed and developed on the photo-sensitive recording paper.

The device illustrated in FIG. 5 may employ a thermal magnetic recording system in which a uniformly magnetized drum is locally heated in response to certain image information to erase or reverse magnetism thereby forming a magnetic latent image.

Figure 6:
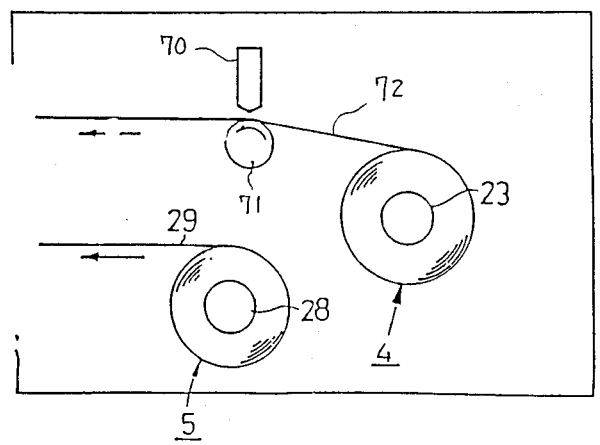
FIG. 6 is a partial schematic structural view showing still further modified color image recording device.

FIG. 6 illustrates a still further modification of the device 1, wherein the laser scanner unit 2 and the Xerography unit 3 are replaced with a thermal printing head 70. Further, a thermosensitive paper 72 is adopted instead of the transmissive element 25, and a platen 71 is arranged oppositely to the printing head 70 instead of the transfer roller 26.

In this modification, the printing head 70 prints the light-shield image on the thermo-sensitive paper 72 with the given contraction ratio with respect to the image information. The enlarged latent image may be formed on the photo-sensitive paper by utilizing the light which passes through or is reflected from the light-shield image printed on the thermo-sensitive paper 72.

The device illustrated in FIG. 6 may employ a dot impact system in which a wire-dot printing head prints a contracted light-shield image on a plain paper through a printing ribbon.

What is claimed is

1. An image recording device wherein an image is recorded on a photo-sensitive recording medium and said image is once formed as a light-shield image before recorded on said photo-sensitive recording medium, which comprises:
   light-shield image forming means for forming said light-shield image in a reduced size with respect to said image to be recorded; and
   enlarged image recording means for recording an image corresponding to said light-shield image in an enlarged size on said photo-sensitive recording medium.

2. The device according to claim 1 wherein said light-shield image forming means comprises a sensitized body and a laser scanning unit which projects laser beams carrying image information corresponding to said image to be recorded so as to form a latent image on said sensitized body in a reduced size, said latent image being developed to said light-shield image with light-shield materials on said sensitized body.

3. The device according to claim 1 wherein said light-shield image forming means comprises a sensitized body and an optical image forming means for forming an optical image in a reduced size corresponding to said image to be recorded, said reduced-size optical image being exposed onto said sensitized body to form a corresponding latent image thereon, said latent image being developed to said light-shield image with light-shield materials on said sensitized body.

4. The device according to claim 3 wherein said optical image forming means comprises a light source for shining a subject carrying said image to be recorded so as to form said optical image, and a lens for reducing the size of said optical image before exposed to said sensitized body.

5. The device according to claim 4 which further comprises a filter provided with a plurality of filter sections, said optical image being exposed to said sensitized body through one of said filter sections.

6. The device according to claim 1 wherein said light-shield image forming means comprises a magnetized head and a magnetized body, and wherein a latent image in a reduced size corresponding to said image to be recorded is formed on said magnetized body by means of said magnetized head, said latent image being developed to said light-shield image with light-shield materials on said magnetized body.

7. The device according to claim 1 wherein said light-shield image forming means comprises a printing head and a printing sheet, and wherein said light-shield image in a reduced size corresponding to said image to be recorded is printed on said printing sheet by said printing head.

8. The device according to claim 7 wherein said printing head is a thermal printing head while said printing sheet is a thermo-sensitive paper.

9. The device according to claim 1 which further comprises a light-transmissive image carrier, and wherein said light-shield image is once transferred onto said image carrier.

10. The device according to claim 9 wherein each end of said image carrier is wound around a winding roller so that said image carrier is runnable between said winding rollers.

11. The device according to claim 9 wherein said enlarged image recording means comprises an optical image forming means for forming an optical image in an enlarged size corresponding to said light shield image carried on said image carrier, and wherein said photo-sensitive recording medium is exposed to said optical image.

12. The device according to claim 11 wherein said optical image forming means comprises a light source and a lens, said image carrier being desposed between said light source and said photo-sensitive recording medium to form an optical image corresponding to said light-shield image, said lens being desposed between said image carrier and said photo-sensitive recording medium to enlarge said optical image.

13. The device according to claim 12 wherein said enlarged image recording means further comprises a filter arranged between said light source and said image carrier, said filter being provided with a plurality of filter sections.

14. The device according to claim 10 wherein said photo-sensitive recording medium is formed as a serial sheet, one end of which is wound on a roller, and wherein said serial-sheet-formed recording medium runs along the running path of said image carrier with the surface thereof opposedly facing to the surface of said image carrier.

* * * * *